United States Patent
Yasui (10) Patent No.: US 11,435,416 B2
(45) Date of Patent: Sep. 6, 2022

(54) MAGNETIC FIELD MEASURING APPARATUS

(71) Applicant: Takashi Yasui, Tokyo (JP)

(72) Inventor: Takashi Yasui, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 183 days.

(21) Appl. No.: 17/077,270

(22) Filed: Oct. 22, 2020

(65) Prior Publication Data
US 2021/0132161 A1 May 6, 2021

(30) Foreign Application Priority Data

Oct. 30, 2019 (JP) ............................. JP2019-197898

(51) Int. Cl.
*G01R 33/00* (2006.01)
*G01R 33/035* (2006.01)

(52) U.S. Cl.
CPC ..... *G01R 33/0356* (2013.01); *G01R 33/0358* (2013.01)

(58) Field of Classification Search
CPC .............. G01R 33/00; G01R 33/0035; G01R 33/0023; G01R 33/0017; G01R 31/3191; G01B 7/004; G01C 17/38; G06F 3/017; G06F 3/0346; G06F 3/012
See application file for complete search history.

(56) References Cited

U.S. PATENT DOCUMENTS

| 7,248,044 B2 | 7/2007 | Kobayashi et al. | |
|---|---|---|---|
| 2002/0060635 A1* | 5/2002 | Gupta | H03M 1/14 341/133 |
| 2006/0095220 A1* | 5/2006 | Vrba | A61B 5/245 702/104 |
| 2007/0114994 A1* | 5/2007 | Kobayashi | G01R 33/0354 324/248 |
| 2012/0016612 A1* | 1/2012 | Kim | G01R 33/0354 702/65 |

FOREIGN PATENT DOCUMENTS

| JP | 2005-296030 | 10/2005 |
|---|---|---|
| JP | 2005-345289 | 12/2005 |
| JP | 4133934 | 8/2008 |
| JP | 2020-153816 | 9/2020 |
| WO | 2020/189643 | 9/2020 |

* cited by examiner

*Primary Examiner* — Jermele M Hollington
*Assistant Examiner* — Taqi R Nasir
(74) *Attorney, Agent, or Firm* — IPUSA, PLLC (57) ABSTRACT

A magnetic field measuring apparatus includes a digital FLL circuit. The digital FLL circuit includes a first amplifier configured to amplify voltage output by a superconducting quantum interference device in accordance with strength of a magnetic field strength, an AD converter configured to, convert analog signals to first digital values, an integrator configured to integrate the first digital values output by the AD converter, a DA converter configured to receive an integral value output by the integrator as a second digital value, convert the second digital value to voltage, and output the converted voltage, a signal switcher configured to connect an output of the first amplifier or an output of the DA converter to an input of the AD converter, and a storage unit configured to store a correction value that corrects the integral value received by the DA converter.

18 Claims, 3 Drawing Sheets

MAGNETIC FIELD MEASURING APPARATUS

CROSS-REFERENCE TO RELATED APPLICATION

The present application is based on and claims priority under 35 U.S.C. § 119 to Japanese Patent Application No. 2019-197898, filed on Oct. 30, 2019, the contents of which are incorporated herein by reference in their entirety.

BACKGROUND OF THE INVENTION

1. Field of the Invention

The present disclosure relates to a magnetic field measuring apparatus.

2. Description of the Related Art

In biomagnetic field measurement using superconducting quantum interference devices (SQUIDs), which are superconducting rings having Josephson junctions, the measurement characteristics are nonlinear. Thus, a flux locked loop (FLL) circuit is used to linearize and measure the magnetic field. Hereinafter, the superconducting quantum interference device is also referred to as SQUID.

There are two types of FLL circuits: an analog FLL system composed of analog circuits only and a digital FLL system composed of circuits that digitalize analog data once and convert the digital data to analog data again. Since multiple channels are commonly used to measure biomagnetic fields, the digital FLL system has been frequently used in terms of reducing variation between channels, reducing the system cost, the easiness of data processing, and the advance in the semiconductor technology.

In a magnetic field measuring apparatus including a SQUID and a digital FLL circuit, a method of reducing the cost using a variation counter that counts the frequency of the magnetic flux quantum and a reproduction counter that counts the frequency corresponding to the magnetic flux to be measured is disclosed (see Patent Document 1).

A method of suppressing a chirp signal that causes noise, in a magnetic field measuring apparatus having multiple channels each including a SQUID, by providing an oscillator that is common to all channels and that determines the oscillation frequency of an AC bias applied to the SQUID is disclosed (see Patent Document 2).

RELATED-ART DOCUMENTS

Patent Documents

Patent Document 1: Japanese Patent No. 4133934
Patent Document 2: Japanese Laid-Open Patent Publication No. 2005-296030

SUMMARY OF THE INVENTION

According to one aspect of an embodiment, a magnetic field measuring apparatus includes a digital FLL circuit. The digital FLL circuit includes a first amplifier configured to amplify voltage output by a superconducting quantum interference device in accordance with strength of a magnetic field, an AD converter configured to convert analog signals to first digital values, an integrator configured to integrate the first digital values output by the AD converter, a DA converter configured to receive an integral value output by the integrator as a second digital value, convert the second digital value to voltage, and output the converted voltage, a signal switcher configured to connect an output of the first amplifier or an output of the DA converter to an input of the AD converter, and a storage unit configured to store a correction value that corrects the integral value received by the DA converter.

DESCRIPTION OF THE EMBODIMENTS

The characteristics of the digital FLL circuit may vary depending on the characteristics of an individual circuit, such as an AD converter or a DA converter mounted in the digital FLL circuit. When the characteristics of the digital FLL circuit vary, values of the magnetic field signal measured by the digital FLL circuit may vary even when the magnetic flux measured by the SQUID is the same, and the magnetic flux measurement performance of the magnetic field measuring apparatus may be degraded.

The disclosed technique has been made in view of the above problem and has an object to suppress the degradation of the magnetic flux measurement performance obtained by the magnetic field measuring apparatus even when there is variation in the characteristics of the digital FLL circuits.

According to at least one embodiment of the present invention, the degradation of the magnetic flux measurement performance obtained by the magnetic field measuring apparatus can be suppressed even when there is variation in the characteristics of the digital FLL circuits.

In the following, embodiments will be described with reference to the drawings. In the drawings, the same components are referenced by the same reference numeral and the overlapping description may be omitted.

First Embodiment

Figure 1:
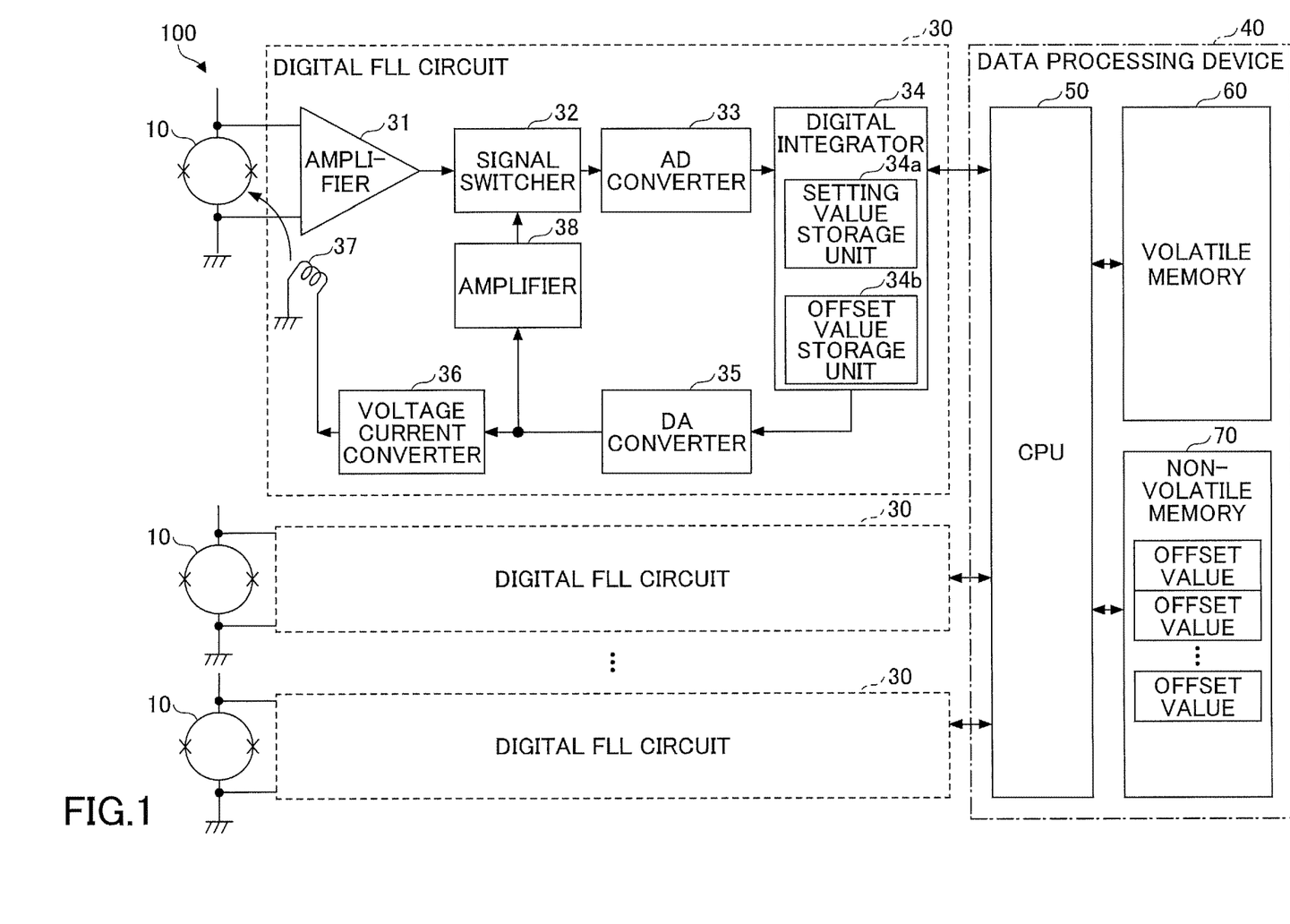
FIG. 1 is a block diagram illustrating an example of a magnetic field measuring apparatus according to a first embodiment of the present invention.

FIG. 1 is a block diagram illustrating an example of a magnetic field measuring apparatus according to a first embodiment of the present invention. For example, a magnetic field measuring apparatus 100 (i.e., a biomagnetic field measuring apparatus) illustrated in FIG. 1 employs a digital FLL system and is applicable to magnetoencephalography, magnetospinography, and magnetocardiography. The magnetic field measuring apparatus 100 illustrated in FIG. 1 may also be applied to the measurement of a neuromagnetic or muscle magnetic field.

TABLE 1

| | MAGNETO-SPINOGRAPHY (MSG) | MAGNETO-CARDIOGRAPHY (MCG) | MAGNETO-ENCEPHA-LOGRAPHY (MEG) |
|---|---|---|---|
| MAGNETIC SENSITIVITY (T) | SEVERAL TO SEVERAL TENS f | SEVERAL TENS f TO 100 p | 10 f TO 10 p |
| SIGNAL BANDWIDTH (Hz) | 100 TO SEVERAL k | 0 TO 1k | 0(0.1) TO SEVERAL HUNDREDS |
| NUMBER OF CHANNELS | UP TO 128 | 1 TO 32 TO 128 | 128 TO 306 |

Table 1 indicates an example of the magnetic sensitivity (T), the signal bandwidth (Hz), and the number of channels for measuring biomagnetic signals for each application (i.e., each object to be measured). As shown in Table 1, the magnetic sensitivity, the signal bandwidth, and number of channels that are required for measuring the biomagnetic field differ in magnetospinography (MSG), magnetocardiography (MCG), and magnetoencephalography (MEG). The number of channels differs according to a location of the measurement and a shape, and tends to increase in the future with the advance in the technology of analyzing biomagnetic signals.

The magnetic field measuring apparatus 100 illustrated in FIG. 1 includes a SQUID 10 and a digital FLL circuit 30 that are provided for each channel, and a data processing device 40 common to multiple digital FLL circuits 30. The magnetic field measuring apparatus 100 may have tens or hundreds of channels, for example, but the number of channels is not limited to this.

The digital FLL circuit 30 includes an amplifier 31, a signal switcher 32, an analog-to-digital (AD) converter 33, a digital integrator 34, a digital-to-analog (DA) converter 35, a voltage current converter 36, a feedback coil 37, and an amplifier 38. The digital integrator 34 includes a setting value storage unit 34a and an offset value storage unit 34b. For example, the setting value storage unit 34a and the offset value storage unit 34b are volatile and lose stored information when a power supply to the digital FLL circuit 30 is stopped.

The amplifier 31 is an example of a first amplifier and the amplifier 38 is an example of a second amplifier. The offset value storage unit 34b is an example of a storage unit that stores an offset value that corrects an integral value input to the DA converter 35. The offset value is an example of a correction value.

The data processing device 40 is a personal computer, a server, or the like, and includes a central processing unit (CPU) 50, a volatile memory 60, and a non-volatile memory 70. For example, the volatile memory 60 is a dynamic random access memory (DRAM) and the non-volatile memory 70 is a flash memory. The CPU 50 is an example of a processor.

The SQUID 10 is a highly sensitive magnetic sensor that detects a magnetic field (i.e., a magnetic flux) that is generated from a living body and that passes through a superconducting ring having a Josephson junction. For example, the SQUID 10 is made by providing Josephson junctions at two positions of the superconducting ring.

The SQUID 10 generates a voltage that varies periodically with respect to a change of the magnetic flux passing through the superconducting ring. Thus, the magnetic flux passing through the superconducting ring can be obtained by measuring the voltages at both ends of the superconducting ring in a state in which a bias current is applied to the superconducting ring. Hereinafter, the characteristic of the periodic voltage change generated by the SQUID 10 is also referred to as the Φ-V characteristic.

The signal switcher 32 is controlled, for example, by the CPU 50 to connect the output of the amplifier 31 to the input of the AD converter 33 during a normal measurement mode and to connect the output of the amplifier 38 to the input of the AD converter 33 during a correction mode. Thus, the digital FLL circuit 30 forms an FLL loop by using the SQUID 10, the amplifier 31, the signal switcher 32, the AD converter 33, the digital integrator 34, the DA converter 35, the voltage current converter 36, and the feedback coil 37 during the normal measurement mode. The normal measurement mode is an operation mode in which the biomagnetic field is measured by the SQUID 10.

The digital FLL circuit 30 also forms a correction loop by using the amplifier 38, the signal switcher 32, the AD converter 33, the digital integrator 34, and the DA converter 35 during the correction mode for obtaining an offset value, which will be described later. That is, the correction loop is a loop obtained by shortcutting the FLL loop and a loop including the DA converter 35 and the AD converter 33.

As described above, by forming the correction loop obtained by shortcutting the FLL loop through a switching control performed by the signal switcher 32, the DA converter 35 and the AD converter 33 used in the normal measurement mode are used to calculate an offset value. Thus, an optimum offset value can be calculated in accordance with the variation in the circuit characteristics of the actual DA converters 35 and the variation in the circuit characteristics of the AD converters 33.

The amplifier 31 amplifies the output voltage generated by the SQUID 10 using the magnetic flux passing through the SQUID 10 in accordance with the strength of the magnetic field during the normal measurement mode, and outputs the amplified output voltage to the AD converter 33 through the signal switcher 32. Additionally, the amplifier 31 has a function to adjust a bias current and adjust offset voltage of the SQUID 10. This enables the amplifier 31 to correct the characteristics of the SQUID 10, which varies among individual devices. The SQUID 10 and the amplifier 31 may be controlled by the CPU 50 to stop an operation during the correction mode.

The AD converter 33 converts an analog signal received through the signal switcher 32 into a digital signal (i.e., a voltage value) and outputs the digital value generated by the conversion to the digital integrator 34. In the normal measurement mode, the AD converter 33 converts the voltage that is output from the SQUID 10 and that is amplified by the amplifier 31 into a digital value, and in the correction mode, the AD converter 33 converts the voltage amplified by the amplifier 38 (for adjusting the offset value) into a digital value. The digital value output by the AD converter 33 is an example of a first digital value.

The digital integrator 34 integrates changes in the voltage of the SQUID 10 (precisely, the amplified voltage output from the amplifier 31) from a working point (or a locking point), which is a starting point of each period of the Φ-V characteristic, during normal measurement mode. The digital integrator 34 outputs, to the DA converter 35, a digital value obtained by adding an offset value (i.e., a positive value or a negative value) stored in the offset value storage unit 34b to an integral value, which is an integrated voltage value. Because the offset value is set to suppress the variation in accordance with the variation in characteristics of the digital FLL circuit 30, the variation in characteristics between channels can be reduced.

During the normal measurement mode, the digital integrator 34 successively outputs the integrated voltage value as magnetic field data to the data processing device 40. For example, the CPU 50 that has received the magnetic field data from each digital FLL circuit 30 stores the received magnetic field data in the volatile memory 60. The CPU 50 processes the magnetic field data stored in the volatile memory 60 and displays, for example, a waveform (or image) representing temporal changes of the magnetic field on a display device (which is not illustrated).

During the correction mode, the digital integrator 34 does not calculate the integral value, but outputs a digital value representing a setting value successively stored in the setting value storage unit 34a by the CPU 50, to the DA converter 35. The setting value successively stored in the setting value storage unit 34a by the CPU 50 is used to obtain the offset value to be used during the normal measurement mode. The setting value storage unit 34a may be disposed outside the digital integrator 34 as long as the setting value storage unit 34a is disposed in the digital FLL circuit 30.

The offset value obtained for each digital FLL circuit 30 is stored in the offset value storage unit 34b of the digital FLL circuit 30 itself. The offset value is used to correct the variation in the characteristics of the digital FLL circuits 30 that is generated in accordance with the circuit characteristics of the AD converters 33, the DA converters 35, or the like mounted in the digital FLL circuits 30 in the normal measurement mode. The offset value storage unit 34b may be disposed outside the digital integrator 34 as long as the offset value storage unit 34b is disposed in the digital FLL circuit 30.

The DA converter 35 converts the digital value output from the digital integrator 34 to voltage, and outputs the converted voltage to the voltage current converter 36 and the amplifier 38. The digital value that is output from the digital integrator 34 and that is input to the DA converter 35 is an example of a second digital value.

The voltage current converter 36 converts the voltage received from the DA converter 35 into a current, and outputs the converted current to the feedback coil 37. During the correction mode, the voltage supply to the voltage current converter 36 may be stopped.

During the correction mode, power consumption of the magnetic field measuring apparatus 100 can be reduced by stopping the operations of the SQUID 10 and the amplifier 31 and stopping the voltage supply to the voltage current converter 36. As described above, since the magnetic field measuring apparatus 100 has several tens of channels or several hundreds of channels each including the SQUID 10 and the digital FLL circuit 30, stopping the circuit operations greatly reduces the power consumption.

The feedback coil 37 generates magnetic flux from the current received from the voltage current converter 36 and feeds back the generated magnetic flux to the SQUID 10 as feedback magnetic flux. That is, the feedback coil 37 generates the magnetic field to be received by the SQUID 10 in accordance with the current from the voltage current converter 36. Feedback of the magnetic flux by the feedback coil 37 enables the voltage generated by the SQUID10 during the normal measurement mode to be maintained near the working point (i.e., in a linear region) of the Φ-V characteristic, thereby accurately obtaining the biomagnetic field signal.

During the correction mode, the amplifier 38 amplifies the voltage received from the DA converter 35 by an integer multiple, and outputs the amplified voltage to the AD converter 33 through the signal switcher 32. The voltage output by the DA converter 35 is amplified by the amplifier 38 by the integer multiple to facilitate corresponding the original voltage output by the DA converter 35 to the voltage output by the amplifier 38.

For example, a gain of the amplifier 38 is determined such that voltage input to the AD converter 33 in accordance with voltage corresponding to 1 least significant bit (LSB) (i.e., a quantization unit) of the DA converter 35 is greater than or equal to voltage corresponding to 1 LSB of the AD converter 33. In other words, the gain of the amplifier 38 is determined to be 2 to the power (DAn−ADn) or greater based on the difference (DAn−ADn) between a bit number DAn of the DA converter 35 and a bit number ADn of the AD converter 33. In the present embodiment, the gain of the amplifier 38 is set to a scale-factor of 128.

Thus, when the digital value input to the DA converter 35 is increased (or decreased) by 1, the digital value output from the AD converter 33 can be increased (or decreased) by 1 or greater. In the present embodiment, when the digital value input to the DA converter 35 is increased (or decreased) by "1", the digital value output from the AD converter 33 can be increased (or decreased) by "8".

A change in voltage sufficiently greater than voltage corresponding to 1 LSB of the AD converter 33 can be input to the AD converter 33, and the digital value can be output from the AD converter 33 with error due to the quantization unit of the AD converter 33 being minimized. As a result, the offset value used in the normal measurement mode can be accurately obtained. In the correction mode, for example, the digital value input to the DA converter 35 is increased (or decreased) by "1" to change the output value of the AD converter 33, thereby easily obtaining the optimum offset value.

For example, the number of input bits of the DA converter 35 DAn is 20 bits, and the number of output bits of the AD converter 33 ADn is 16 bits. When DAn=20 and ADn=16, 2 to the power of (DAn−ADn) is "16" (an integer multiple). In this case, the gain of the amplifier 38 is preferably set to a power of two (e.g., "16", "32", "64, or "128").

When the number of input bits of the DA converter 35 is greater than the number of output bits of the AD converter 33, error due to the quantization unit of the AD converter 33 in obtaining the offset value can be reduced by providing the amplifier 38. The gain of the amplifier 38 is set to a power of 2, so that, for example, the digital value (binary number) output from the AD converter 33 is shifted to the right only by the number of the power to easily calculate the digital value output from the DA converter 35 before the amplification. That is, the gain of the amplifier 38 is set to a power of 2 so as to facilitate data processing of the data processing device 40 relative to a case in which the gain is not a power of 2.

The CPU 50 controls an overall operation of the magnetic field measuring apparatus 100. The CPU 50 controls each digital FLL circuit 30 to obtain the offset value for the digital FLL circuit 30 itself during the correction mode. For example, the CPU 50 successively stores the setting value within a predetermined range including "0" in the setting value storage unit 34a and successively inputs the setting value stored in the setting value storage unit 34a to the DA converter 35.

For example, the CPU 50 successively stores the setting value common to all the digital FLL circuits 30 included in the magnetic field measuring apparatus 100 in the respective setting value storage units 34a. This enables the CPU 50 to perform the operations of the correction mode for obtaining the offset values for the respective digital FLL circuits 30 in parallel in all the digital FLL circuits 30 to minimize the time required to obtain the offset value.

The DA converter 35 successively outputs the voltage corresponding to the received setting value to the amplifier 38, the amplifier 38 amplifies the voltage corresponding to the setting value, and the AD converter 33 outputs the digital value corresponding to the voltage amplified by the amplifier 38. The CPU 50 receives the digital value output from the AD converter 33 through the digital integrator 34 and stores the received digital value in the volatile memory 60.

The CPU 50 determines the setting value stored in the setting value storage unit 34a when an absolute value of the digital value output by the AD converter 33 is a minimum, as an offset value used in the normal measurement mode, for each digital FLL circuit 30. The CPU 50 writes the determined offset value to the non-volatile memory 70. Subsequently, when the magnetic field measuring apparatus 100 is started, the CPU 50 reads out the offset value for each digital FLL circuit 30 from the non-volatile memory 70 and stores the read offset value in the offset value storage unit 34b of the corresponding digital FLL circuit 30.

This enables the magnetic field measuring apparatus 100 to accurately measure the biomagnetic field in the normal measurement mode by using an appropriate offset value obtained in the correction mode. In other words, even when there is variation in the characteristics of the digital FLL circuits 30, the variation can be corrected by the offset value, thereby suppressing the degradation of the magnetic flux measurement performance of the magnetic field measuring apparatus 100. Further, the offset value can be obtained for each digital FLL circuit 30 in accordance with the variation in the circuit characteristics of the AD converters 33 or the DA converters 35, thereby reducing the variation of the characteristics between channels. Thus, the measurement performance of the magnetic field measuring apparatus 100 can be improved.

Figure 2:
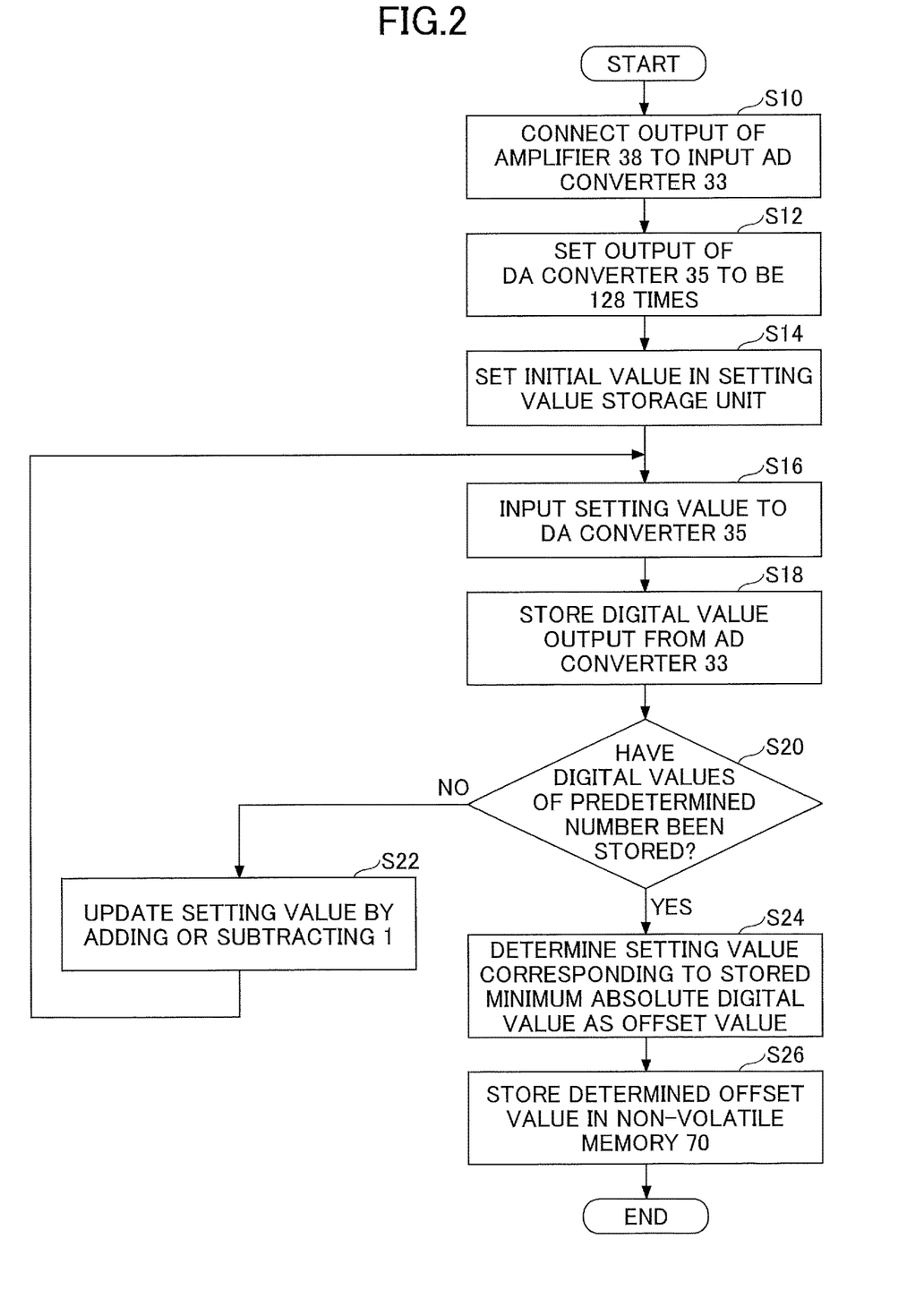
FIG. 2 is a flowchart illustrating an example of an operation that determines an offset value by using a correction mode in the magnetic field measuring apparatus of FIG. 1.

FIG. 2 is a flowchart illustrating an example of an operation that determines an offset value by using the correction mode in the magnetic field measuring apparatus 100 of FIG. 1. The operation flow illustrated in FIG. 2 is started in response to the operation mode of the magnetic field measuring apparatus 100 transitioning to the correction mode. For example, the transition to the correction mode is performed by an operator or the like of the magnetic field measuring apparatus 100 operating an input device, such as a mouse or a keyboard, based on a screen displayed on the display device of the data processing device 40. The magnetic field measuring apparatus 100 transitions to the correction mode before the magnetic field measuring apparatus 100 transitions to the first normal measurement mode.

The operation flow illustrated in FIG. 2 is achieved by the CPU 50 executing an offset setting program stored in the volatile memory 60. The operation flow illustrated in FIG. 2 may be achieved by hardware, such as a field-programmable gate array (FPGA) or an ASIC mounted in the magnetic field measuring apparatus 100.

The operation flow illustrated in FIG. 2 is performed in parallel in each of the digital FLL circuits 30 mounted in the magnetic field measuring apparatus 100. Therefore, in comparison with a case in which the offset values of multiple digital FLL circuits 30 are sequentially obtained, the time duration required for the operation to obtain the offset value can be reduced, and the time duration during the correction mode can be minimized.

First, in step S10, the CPU 50 controls the signal switcher 32 to connect the output of the amplifier 38 to the input of the AD converter 33. Next, in step S12, the CPU 50 sets the gain of the amplifier 38 to, for example, a scale-factor of 128 by controlling the amplifier 38, to set the output of the DA converter 35 to be 128 times.

Next, in step S14, the CPU 50 sets an initial value, as the setting value, in the setting value storage unit 34a of the digital integrator 34. For example, the initial value is "0", a minimum value of the setting value (a negative value), or the maximum value of the setting value (a positive value). The order in which the steps S10, S12, and S14 are performed is not limited to the order illustrated in FIG. 2, but may be any order.

Next, in step S16, the CPU 50 controls the digital integrator 34 to input the setting value set in the setting value storage unit 34a to the DA converter 35. The DA converter 35 outputs the voltage corresponding to the received setting value, and the amplifier 38 amplifies the voltage output by the DA converter 35, for example, by 128 times. The AD converter 33 converts the voltage amplified by the amplifier 38 into a digital value and outputs the converted digital value to the digital integrator 34.

Next, in step S18, the CPU 50 stores the digital value output from the AD converter 33 through the digital integrator 34 in the volatile memory 60. Here, the digital value output from the AD converter 33 may be stored in an internal memory of the CPU 50 or a hard disk connected to the data processing device 40, or may be stored in the non-volatile memory 70, for example.

Next, in step S20, the CPU 50 determines whether a predetermined number of digital values have been stored, and when the predetermined number of digital values have been stored, step S24 is performed. When the number of the stored digital values is smaller than the predetermined number, step S22 is performed. Here, the predetermined number is a number of setting values from a predetermined negative value to a predetermined positive value across "0".

In step S22, the CPU 50 updates the setting value of the setting value storage unit 34a by adding or subtracting 1, and then returns to step S16. For example, when the initial value of the setting value is a negative value in step S14, the CPU 50 successively updates the setting value by adding 1, and when the initial value of the setting value is a positive value in step S14, the CPU 50 successively updates the setting value by subtracting 1. The AD converter 33 successively outputs "0", a positive digital value close to "0", or a negative digital value close to "0" by successively providing multiple setting values within the predetermined range including "0" to the input of the DA converter 35. This can obtain the offset value in accordance with the variation in the characteristics of the digital FLL circuits 30 by using a minimum number of setting values.

In step S24, the CPU 50 detects a minimum value (i.e., a minimum absolute value) from multiple digital values stored in the volatile memory 60 (i.e., the output values of the AD converter 33). The CPU 50 determines the setting value that has been input to the DA converter 35 when the AD converter 33 outputs the detected minimum value, as the offset value. By detecting the absolute minimum value, a digital value closest to "0" can be detected even when the AD converter 33 outputs discrete digital values other than "0".

Next, in step S26, the CPU 50 stores the offset value determined in step S24 in the non-volatile memory 70 and ends the operation illustrated in FIG. 2. When the FPGA is mounted in the magnetic field measuring apparatus 100, the offset value may be stored in the non-volatile memory in which the logical information for programming the FPGA is stored.

Subsequently, at the start of the magnetic field measuring apparatus 100, the CPU 50 stores the offset value stored for each of the digital FLL circuits 30 in the non-volatile memory 70, in the offset value storage unit 34b of the corresponding digital FLL circuit 30. As described in FIG. 1, during the normal measurement mode, the digital integrator 34 outputs, to the DA converter 35, the digital value obtained by adding the offset value stored in the offset value storage unit 34b to the integral value, which is the integrated voltage value.

By storing the offset value determined in step S24 in the non-volatile memory 70, even when the offset value storage unit 34b is volatile, the offset value can be stored without loss. This can correct the circuit characteristics of the AD converter 33 and the DA converter 35 by using the offset value so that the circuit characteristics appear to be equal even when the circuit characteristics of the AD converters 33 and the DA converters 35 vary between the digital FLL circuits 30 (between channels). Therefore, it is possible to prevent the overall performance from being limited by the lowest performance channel when there is a large variation in the circuit characteristics, thereby improving the performance of measuring the magnetic field performed by the magnetic field measuring apparatus 100.

In step S14, an initial value of a negative value may be set in the setting value storage unit 34a as the setting value, and in step S22, the setting value may be successively increased. Alternatively, in step S14, an initial value of a positive value may be set in the setting value storage unit 34a as the setting value, and in step S22, the setting value may be successively decreased. In step S20, it may be determined whether the absolute value of the digital value output from the AD converter 33 is a minimum value, and when it is determined that the absolute value is the minimum value, the process may proceed to step S24. Thus, it is possible to exit the loop from step S16 to step S22 at the time when the minimum value is determined, thereby reducing the time for obtaining the offset value.

As described above, in the present embodiment, the offset value storage unit 34b that stores the offset value for correcting the integral value input to the DA converter 35 is provided in the digital FLL circuit 30. Thus, even when there is variation in the characteristics of the digital FLL circuits 30, the variation can be corrected by the offset value, thereby suppressing the degradation of the magnetic flux measurement performance of the magnetic field measuring apparatus 100. In other words, when the biomagnetic field or the like is measured by the digital FLL circuit 30 in the normal measurement mode, the magnetic flux can be measured with high accuracy without depending on the variation in characteristics of the digital FLL circuits 30.

Because the optimum offset value can be obtained for each of multiple digital FLL circuits 30, the circuit characteristics, such as the characteristics of the AD converter 33 and the DA converter 35, can be corrected by the offset value so that the circuit characteristics appear to be equal even when the circuit characteristics vary between channels. Therefore, it is possible to prevent the overall performance from being limited by the lowest performance channel when the variation in the circuit characteristics is large, thereby improving the magnetic field measurement performance of the magnetic field measuring apparatus 100.

By using the correction loop, which is a loop obtained by shortcutting the FLL loop through the signal switcher 32 and includes the DA converter 35 and the AD converter 33 used in the normal measurement mode, the offset value can be obtained. Therefore, the optimum offset value can be obtained corresponding to the variation in the circuit characteristics of the DA converters 35 and the variation in the circuit characteristics of the AD converters 33.

By providing the amplifier 38 that amplifies the voltage output from the DA converter 35 and that supplies the amplified voltage to the AD converter 33, a voltage having a voltage change sufficiently greater than a voltage equivalent to 1 LSB of the AD converter 33 can be input to the AD converter 33. As a result, the digital value can be output from the AD converter 33 with error caused by the quantization unit of the AD converter 33 being minimized, thereby accurately determining the offset value used in the normal measurement mode. In particular, when the number of input bits of the DA converter 35 is greater than the number of output bits of the AD converter 33, the influence of error caused by the quantization unit of the AD converter 33 can be reduced by providing the amplifier 38.

By successively providing multiple setting values within a predetermined range including "0" to the input of the DA converter 35, the AD converter 33 can successively output "0", or a positive or negative digital value close to "0". This can determine an offset value corresponding to the variation in the characteristics of the digital FLL circuits 30 by using a minimum number of setting values. By detecting the minimum absolute value of the digital value output from the AD converter 33, even when the AD converter 33 outputs discrete digital values other than "0", the digital value closest to "0" can be detected.

By storing the offset value in the non-volatile memory 70, even when the offset value storage unit 34b is volatile, the offset value can be maintained without loss, and the magnetic flux can be measured with high accuracy using the offset value in the normal measurement mode.

By performing the operations of obtaining the offset value in parallel in all the digital FLL circuits 30 mounted in the magnetic field measuring apparatus 100, the time duration required for the operation of obtaining the offset value can be reduced in comparison with a case in which the offset values of multiple digital FLL circuits 30 are sequentially obtained.

Second Embodiment

Figure 3:
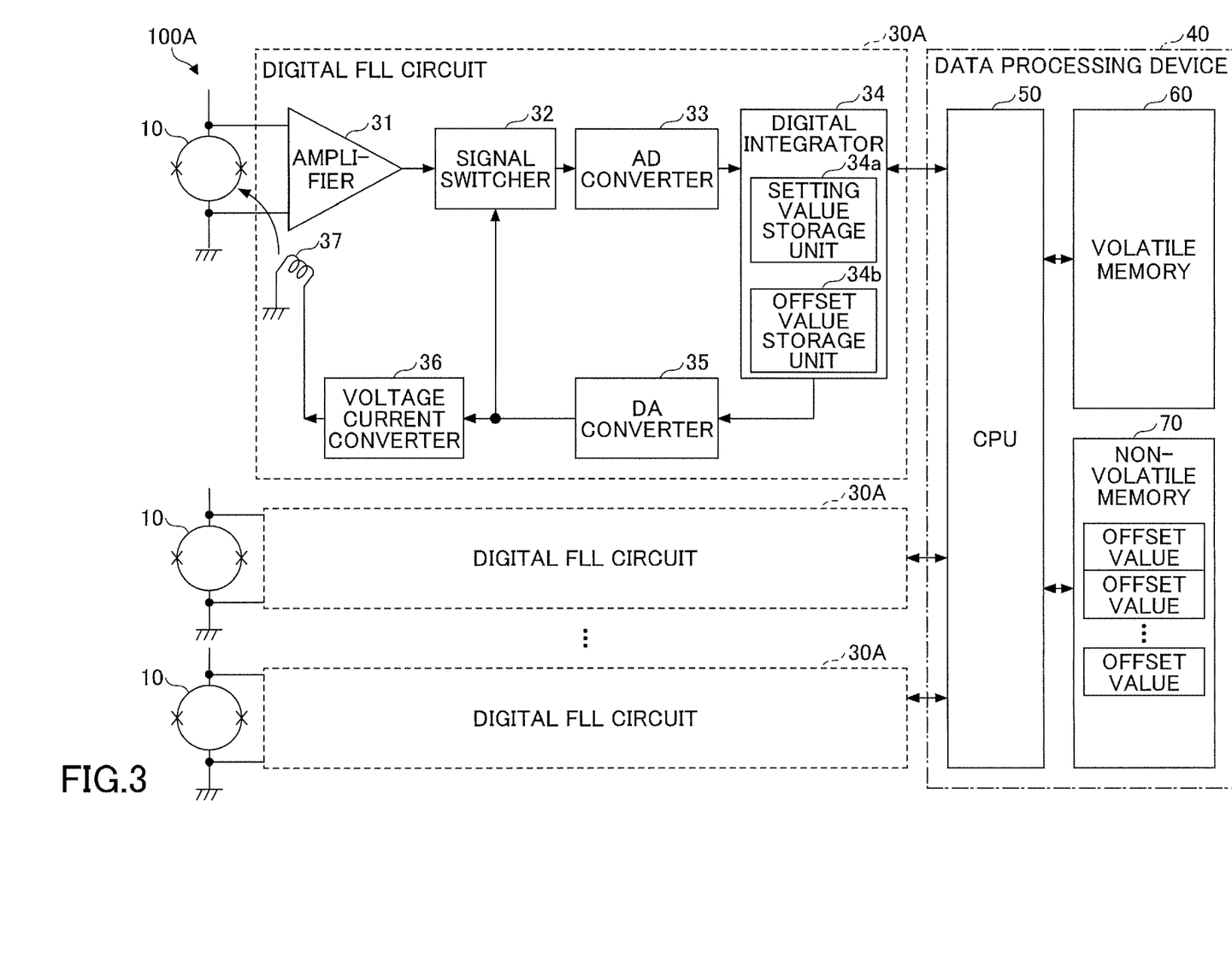
FIG. 3 is a block diagram illustrating an example of a magnetic field measuring apparatus according to a second embodiment of the present invention.

FIG. 3 is a block diagram illustrating an example of a magnetic field measuring apparatus according to a second embodiment of the present invention. For elements similar to FIG. 1, the same reference numeral will be used, and the detailed description will be omitted. A magnetic field measuring apparatus 100A (i.e., a biomagnetic field measuring apparatus) illustrated in FIG. 3 includes the SQUID 10 and a digital FLL circuit 30A provided for each channel, and the data processing device 40 common to the multiple digital FLL circuits 30A.

The digital FLL circuit 30A is configured by removing the amplifier 38 from the digital FLL circuit 30 illustrated in FIG. 1. Thus, during the normal measurement mode, the signal switcher 32 connects the output of the amplifier 31 to the input of the AD converter 33, and during the correction mode, the signal switcher 32 connects the output of the DA converter 35 to the input of the AD converter 33.

In the present embodiment, for example, the bit number of the digital value DAn input by the DA converter 35 is 20 bits, and the bit number of the digital value ADn output by the AD converter 33 is 16 bits. In this case, in the correction mode, the CPU 50 successively stores, in the setting value storage unit 34a, digital values within a predetermined range including "0" that are discretized for every 128, for example, and the CPU 50 successively input the setting value stored in the setting value storage unit 34a to the DA converter 35. The CPU 50 may successively store digital values discretized for every 64 in the setting value storage unit 34a.

For example, when the digital values discretized for every 128 are successively input to the DA converter 35, the AD converter 33 outputs a digital value that is discrete by approximately eight times the quantization unit ($128/2^4$=8), similarly with the first embodiment. That is, in the correction mode, the CPU 50 sets the change amount of the digital value input to the DA converter 35 such that the change amount of the digital value output by the AD converter 33 corresponding to the voltage successively input to the AD converter 33 is greater than the quantization unit of the AD converter 33.

In the present embodiment, the operation flow that determines the offset value in the correction mode is similar to the operation flow of FIG. 2, except that step S12 of FIG. 2 is removed and the operation of step S22 of FIG. 2 is changed to "update the setting value by adding or subtracting 128".

This can determine an offset value with the accuracy similar to the accuracy of the above-described embodiment without providing the amplifier 38 illustrated in FIG. 1 in the digital FLL circuit 30A. When the number of bits of the digital value input by the DA converter 35 is smaller than or equal to the number of bits of the digital value output by the AD converter 33, the operation flow that determines the offset value in the correction mode is similar to the operation flow of FIG. 2, except that step S12 of FIG. 2 is removed.

As described above, in the second embodiment, an effect similar to the effect of the first embodiment can be obtained. Further, in the second embodiment, the size of the digital FLL circuit 30A can be reduced relative to the digital FLL circuit 30 because the offset value can be obtained without providing the amplifier 38. As a result, the cost of the magnetic field measuring apparatus 100A having an offset value adjustment function can be reduced.

In the embodiment described above, an example in which the offset value stored in the non-volatile memory 70 for each of the digital FLL circuits 30 (or 30A) is transferred from the non-volatile memory 70 to the offset value storage unit 34b at starting the magnetic field measuring apparatus 100 (or 100A) is described. However, when the offset value storage unit 34b is composed of non-volatile elements, the CPU 50 may directly store the obtained offset value in the offset value storage unit 34b without storing the obtained offset value in the non-volatile memory 70. In this case, because a start process of the magnetic field measuring apparatus 100 (or 100A) can be performed without reading the offset value from the non-volatile memory 70, the time duration of the start process can be reduced.

Although in the above-described embodiments, applications to a biomagnetic field measuring apparatus, such as magnetoencephalography, magnetospinography, and magnetocardiography, have been described, an embodiment may be an application to a magnetic field measuring apparatus other than a biomagnetic field measuring apparatus.

Although the invention has been described above in accordance with the embodiments, the invention is not limited to the requirements described in the embodiments. In these points, alterations can be made without departing from the spirit and scope of the invention, and can be suitably determined according to its application.

What is claimed is:

1. A magnetic field measuring apparatus comprising a digital flux locked loop (FLL) circuit including:
    a first amplifier configured to amplify voltage output by a superconducting quantum interference device in accordance with strength of a magnetic field;
    an AD converter configured to convert analog signals to first digital values;
    an integrator configured to integrate the first digital values output by the AD converter;
    a DA converter configured to receive an integral value output by the integrator as a second digital value, convert the second digital value to voltage, and output the converted voltage;
    a signal switcher configured to connect an output of the first amplifier or an output of the DA converter to an input of the AD converter; and
    a storage unit configured to store a correction value that corrects the integral value received by the DA converter.

2. The magnetic field measuring apparatus as claimed in claim 1, wherein the digital FLL circuit further includes a second amplifier configured to amplify the voltage output by the DA converter, and the output of the DA converter is connected to the signal switcher through the second amplifier.

3. The magnetic field measuring apparatus as claimed in claim 2, wherein the second amplifier amplifies the voltage output by the DA converter by an integer multiple.

4. The magnetic field measuring apparatus as claimed in claim 2, wherein a number of input bits of the DA converter that receives the second digital value is greater than a number of output bits of the AD converter that outputs the first digital values.

5. The magnetic field measuring apparatus as claimed in claim 1,
    wherein the digital FLL circuit further includes a voltage current converter configured to convert the voltage output by the DA converter to a current and a feedback coil configured to generate a magnetic field to be received by the superconducting quantum interference device in accordance with the current output by the voltage current converter,
    wherein the signal switcher connects the output of the first amplifier to the input of the AD converter in a normal measurement mode in which a magnetic field is measured in accordance with the voltage output by a superconducting quantum interference device, and
    wherein the signal switcher connects the output of the DA converter to the input of the AD converter in a correction mode in which the correction value is obtained.

6. The magnetic field measuring apparatus as claimed in claim 5, comprising a processor configured to, in the correction mode, provide a plurality of said second digital values within a predetermined range including 0 to the input of the DA converter and determine the correction value based on the first digital values output by the AD converter in accordance with the output of the DA converter received through the signal switcher.

7. The magnetic field measuring apparatus as claimed in claim 6, wherein the processor determines the second digital value that has been input to the DA converter when the AD converter outputs a minimum absolute value of the first digital values, as the correction value.

8. The magnetic field measuring apparatus as claimed in claim 6, wherein the processor sets a change amount of the second digital values such that a change amount of the first digital values output by the AD converter in accordance with the voltage successively input to the AD converter is greater than a quantization unit of the AD converter.

9. The magnetic field measuring apparatus as claimed in claim 6, further comprising a non-volatile memory that stores the determined correction value,
wherein the storage unit is volatile,
wherein the processor reads the correction value from the non-volatile memory and stores the read correction value in the storage unit, and
wherein, in the normal measurement mode, the integrator outputs, to the DA converter, a value obtained by correcting the integral value by using the correction value stored in the storage unit as the second digital value.

10. The magnetic field measuring apparatus as claimed in claim 6,
wherein the storage unit is non-volatile,
wherein the processor stores the determined correction value in the storage unit, and
wherein, in the normal measurement mode, the integrator outputs, to the DA converter, a value obtained by correcting the integral value by using the correction value as the second digital value.

11. The magnetic field measuring apparatus as claimed in claim 6, comprising a plurality of said digital FLL circuits,
wherein, in the correction mode, the processor provides the common second digital value to the input of the DA converter of each of the plurality of digital FLL circuits and an operation that determines the correction value for each of the plurality of digital FLL circuits is performed in parallel.

12. The magnetic field measuring apparatus as claimed in claim 8, wherein the processor sets the change amount of the second digital values to be an integer multiple of the quantization unit of the AD converter.

13. The magnetic field measuring apparatus as claimed in claim 2,
wherein the digital FLL circuit further includes a voltage current converter configured to convert the voltage output by the DA converter to a current and a feedback coil configured to generate a magnetic field to be received by the superconducting quantum interference device in accordance with the current output by the voltage current converter,
wherein the signal switcher connects the output of the first amplifier to the input of the AD converter in a normal measurement mode in which a magnetic field is measured in accordance with the voltage output by a superconducting quantum interference device, and
wherein the signal switcher connects the output of the DA converter to the input of the AD converter in a correction mode in which the correction value is obtained.

14. The magnetic field measuring apparatus as claimed in claim 13, comprising a processor configured to, in the correction mode, provide a plurality of said second digital values within a predetermined range including 0 to the input of the DA converter and determine the correction value based on the first digital values output by the AD converter in accordance with the output of the DA converter received through the signal switcher.

15. The magnetic field measuring apparatus as claimed in claim 14, wherein the processor determines the second digital value that has been input to the DA converter when the AD converter outputs a minimum absolute value of the first digital values, as the correction value.

16. The magnetic field measuring apparatus as claimed in claim 14, further comprising a non-volatile memory that stores the determined correction value,
wherein the storage unit is volatile,
wherein the processor reads the correction value from the non-volatile memory and stores the read correction value in the storage unit, and
wherein, in the normal measurement mode, the integrator outputs, to the DA converter, a value obtained by correcting the integral value by using the correction value stored in the storage unit as the second digital value.

17. The magnetic field measuring apparatus as claimed in claim 14,
wherein the storage unit is non-volatile,
wherein the processor stores the determined correction value in the storage unit, and
wherein, in the normal measurement mode, the integrator outputs, to the DA converter, a value obtained by correcting the integral value by using the correction value as the second digital value.

18. The magnetic field measuring apparatus as claimed in claim 14, comprising a plurality of said digital FLL circuits,
wherein, in the correction mode, the processor provides the common second digital value to the input of the DA converter of each of the plurality of digital FLL circuits and an operation that determines the correction value for each of the plurality of digital FLL circuits is performed in parallel.

* * * * *